(12) United States Patent
Yokosawa et al.

(10) Patent No.: US 9,155,220 B2
(45) Date of Patent: Oct. 6, 2015

(54) CASING MOUNTING RAIL, BLANK PLATE, AND RACK MOUNT SYSTEM

(71) Applicant: FUJITSU LIMITED, Kawasaki-shi, Kanagawa (JP)

(72) Inventors: Takanaga Yokosawa, Kawasaki (JP); Takashi Watanabe, Kawasaki (JP); Yasuhiro Muramatsu, Kawasaki (JP); Takashi Fukuda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 116 days.

(21) Appl. No.: 14/171,003

(22) Filed: Feb. 3, 2014

(65) Prior Publication Data
US 2014/0144858 A1 May 29, 2014

Related U.S. Application Data

(63) Continuation of application No. PCT/JP2011/069083, filed on Aug. 24, 2011.

(51) Int. Cl.
*A47F 7/00* (2006.01)
*H05K 7/18* (2006.01)
*H05K 7/14* (2006.01)

(52) U.S. Cl.
CPC .............. *H05K 7/183* (2013.01); *H05K 7/1489* (2013.01)

(58) Field of Classification Search
CPC .............................. H05K 7/1489; H05K 7/183
USPC ........... 211/26, 182; 312/223.1, 265.1–265.4, 312/334.4, 334.5; 361/724–727
See application file for complete search history.

(56) References Cited

U.S. PATENT DOCUMENTS

| 5,653,518 | A | * | 8/1997 | Hardt | 312/334.4 |
| 5,941,621 | A | * | 8/1999 | Boulay et al. | 312/334.4 |
| 6,021,909 | A | * | 2/2000 | Tang et al. | 211/183 |
| 6,070,742 | A | * | 6/2000 | McAnally et al. | 211/26 |
| 6,523,918 | B1 | * | 2/2003 | Baiza | 312/265.1 |
| 6,615,993 | B1 | * | 9/2003 | Rudiger | 211/26 |

(Continued)

FOREIGN PATENT DOCUMENTS

| JP | 02-142596 | 12/1990 |
| JP | 11-340655 | 12/1999 |
| JP | 2008-130714 | 6/2008 |

OTHER PUBLICATIONS

International Search Report, mailed in connection with PCT/JP2011/069083 and mailed Oct. 25, 2011.

*Primary Examiner* — Joshua J Michener
*Assistant Examiner* — Devin Barnett
(74) *Attorney, Agent, or Firm* — Fujitsu Patent Center

(57) ABSTRACT

A coupling member is coupled to a support column of a rack. A plate-shaped member is rotatably engaged with a coupling member with one longitudinal end as an axis. An L-shaped member includes a first flat plate and a second flat plate orthogonal to the first flat plate and includes, with a transverse end of the first flat plate rotatably engaged with one plate face of the plate-shaped member with the longitudinal direction of the plate-shaped member as an axis and with a plate face of the first flat plate in intimate contact with the one plate face, a mounting member in which the second flat plate protrudes from one transverse end of the plate-shaped member and a fixing mechanism that fixes the mounting member with the plate face of the first flat plate in intimate contact with the one plate face of the plate-shaped member.

8 Claims, 16 Drawing Sheets

(56) References Cited

U.S. PATENT DOCUMENTS

| | | | |
|---|---|---|---|
| 6,739,682 B2* | 5/2004 | Shih | 312/334.4 |
| 6,891,727 B2* | 5/2005 | Dittus et al. | 361/724 |
| 6,929,339 B1* | 8/2005 | Greenwald et al. | 312/334.4 |
| 6,935,711 B1* | 8/2005 | Naue et al. | 312/334.4 |
| 7,255,409 B2* | 8/2007 | Hu et al. | 312/334.4 |
| 7,331,644 B2* | 2/2008 | Lowe | 312/334.4 |
| 7,630,197 B2* | 12/2009 | Chen | 361/679.33 |
| 7,798,582 B2* | 9/2010 | Yu et al. | 312/334.4 |
| 8,033,621 B2* | 10/2011 | Liang | 312/334.4 |
| 8,162,417 B2* | 4/2012 | Briggs et al. | 312/223.2 |
| 8,251,321 B2* | 8/2012 | Chen et al. | 248/70 |
| 8,371,454 B2* | 2/2013 | Chen et al. | 211/26 |
| 8,395,899 B2* | 3/2013 | Li et al. | 361/726 |
| 8,562,086 B1* | 10/2013 | Baik et al. | 312/334.4 |
| 8,701,902 B2* | 4/2014 | Oura | 211/192 |
| 2001/0040142 A1* | 11/2001 | Haney | 211/183 |
| 2002/0100736 A1* | 8/2002 | Lopez | 211/26 |
| 2002/0195408 A1* | 12/2002 | Hegrenes et al. | 211/26 |
| 2004/0104651 A1* | 6/2004 | Kreft et al. | 312/334.5 |
| 2004/0108289 A1* | 6/2004 | Chen et al. | 211/183 |
| 2006/0157436 A1* | 7/2006 | Iwamoto | 211/191 |
| 2007/0158280 A1* | 7/2007 | Cox et al. | 211/26 |
| 2007/0262684 A1* | 11/2007 | Huang | 312/334.4 |
| 2008/0164789 A1* | 7/2008 | Williams | 312/223.1 |
| 2008/0230496 A1* | 9/2008 | Henderson et al. | 211/26 |
| 2009/0114785 A1* | 5/2009 | Huang et al. | 248/220.31 |
| 2011/0186532 A1* | 8/2011 | Wu | 211/26 |
| 2011/0226710 A1* | 9/2011 | Peng et al. | 211/26 |
| 2012/0132598 A1* | 5/2012 | Wang et al. | 211/26 |
| 2012/0161599 A1* | 6/2012 | Chen et al. | 312/333 |
| 2012/0175477 A1* | 7/2012 | Tang et al. | 248/222.14 |
| 2012/0211447 A1* | 8/2012 | Anderson et al. | 211/26 |
| 2012/0325760 A1* | 12/2012 | Li | 211/26 |
| 2013/0082013 A1* | 4/2013 | Zhou | 211/26 |
| 2013/0087518 A1* | 4/2013 | He | 211/26 |
| 2013/0163198 A1* | 6/2013 | Li et al. | 361/679.58 |
| 2015/0048041 A1* | 2/2015 | Chuang | 211/175 |
| 2015/0122752 A1* | 5/2015 | Shen et al. | 211/26 |

* cited by examiner

CASING MOUNTING RAIL, BLANK PLATE, AND RACK MOUNT SYSTEM

CROSS-REFERENCE TO RELATED APPLICATIONS

This application is a continuation of International Application No. PCT/JP2011/069083, filed on Aug. 24, 2011, the entire contents of which are incorporated herein by reference.

FIELD

The embodiments discussed herein are related to a casing mounting rail, a blank plate, and a rack mount system.

BACKGROUND

In a computer system, as the scale of the system increases, the number of electronic devices in the system such as servers, storages, and network devices increases. For the increased number of electronic devices, a storage frame called a rack is used to store the electronic devices efficiently and achieve space saving. To mount the electronic devices in the rack, casing mounting rails for mounting the casing of the electronic devices are laid from the front side to the rear side of the rack. The electronic devices are mounted in the rack in a stacked manner with their casing mounted on the casing mounting rails.

This casing mounting rail is fixed to a support on the front side of the rack and another support on the rear side of the rack. Processes for fixing the casing mounting rail to the rack thus include a fixation process on the front side of the rack and a fixation process on the rear side of the rack.

When mounted to a rack, the electronic devices do not necessarily fill the rack. When the electronic devices thus mounted do not fill the rack, a part with no electronic device mounted results in space within the rack. In this case, when such space is given on the front face of the rack, the exhaust air of the electronic devices is returned and sucked back into the electronic devices. This state interferes with appropriate cooling of the electronic devices and accumulates heat in the electronic devices, which causes a failure. In view of these circumstances, a blank plate is attached to fill the space on the front face in racks.

As such a filling blank plate in related art, a blank plate serves as a shelf to house a printed circuit board on which electronic circuits are mounted. When the printed circuit board is inserted, the blank plate opens and serves as a guide rail supporting the insertion of the printed circuit board (Japanese Laid-open Patent Publication No. 11-340655).

A conventional general blank plate is a monolithic plate formed of iron or the like, and is selectively attached according to the size of open space as occasion demands. Because of this, to mount a new electronic device to the open space, space used to mount the electronic device is checked in advance, a mounting place is determined, and a blank plate attached to the place is removed. Subsequently, casing mounting rails for mounting the electronic device are laid, and the electronic device is mounted on the casing mounting rails. The process for mounting the electronic device to the open space of the rack is thus complicated and time consuming.

The conventional technology that functions as both the guide rail and the blank plate reduces the trouble with removing a blank plate and the trouble with laying rails. However, in an electronic device such as a server, its casing has a thickness. Given this situation, in this conventional technology, when a plurality of blank plates are arranged, an electronic device comes into contact with a protrusion for mounting the electronic device, making it hard to mount the electronic device.

SUMMARY

According to an aspect of an embodiment, a casing mounting rail includes: a coupling member coupled to a support column of a rack; a plate-shaped member rotatably engaged with the coupling member with one longitudinal end as an axis; a mounting member including a first flat plate and a second flat plate orthogonal to the first flat plate, with a transverse end of the first flat plate rotatably engaged with one plate face of the plate-shaped member with a longitudinal direction of the plate-shaped member as an axis and with a plate face of the first flat plate in intimate contact with the one plate face, the second flat plate protruding from one transverse end of the plate-shaped member; and a fixing mechanism that fixes the mounting member with the plate face of the first flat plate in intimate contact with the one plate face.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 10 is a sectional view illustrating an engaging hole of engaging parts 111A to 111C for passing the engaging shaft through;

DESCRIPTION OF EMBODIMENTS

Preferred embodiments of the present invention will be explained with reference to accompanying drawings.

The following embodiments do not limit the casing mounting rail, the blank plate, and the rack mount system disclosed by the present application. Because the blank plate serves also as the casing mounting rail, the blank plate will be described as the casing mounting rail.

[a] First Embodiment

Figure 1:
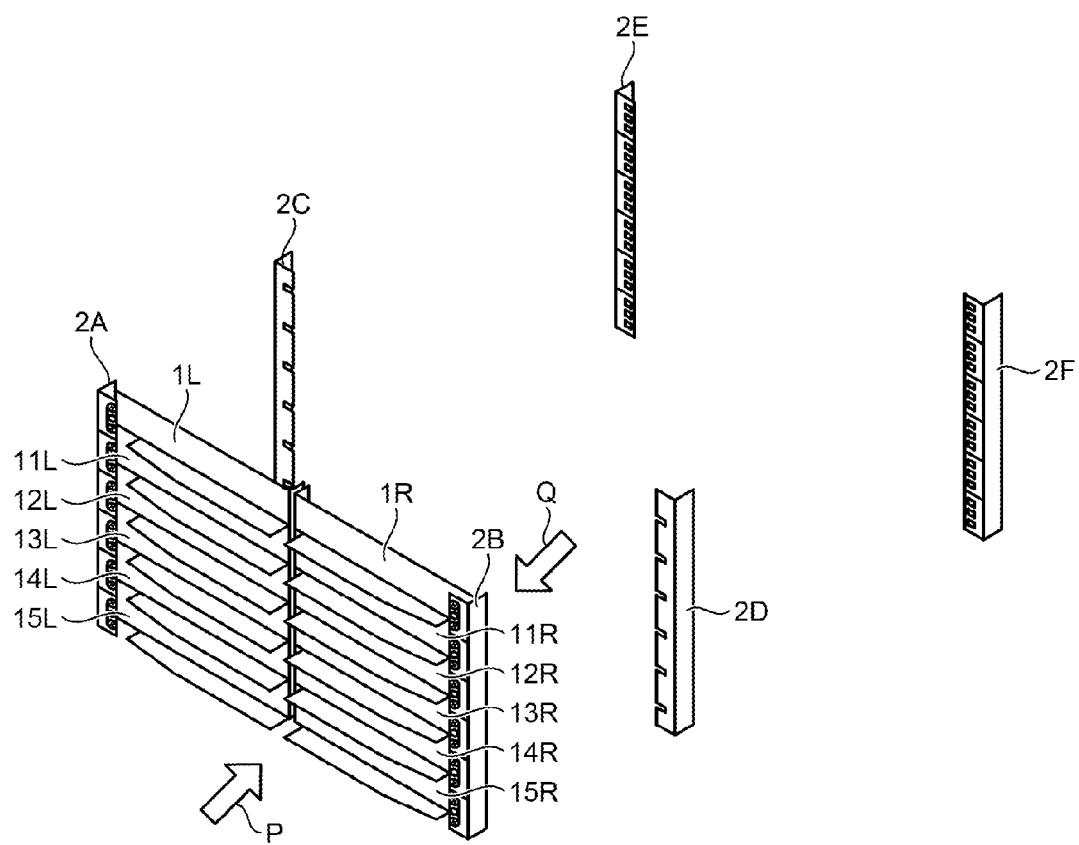
FIG. 1 is a perspective view illustrating casing mounting rails according to a first embodiment when installed in a rack.

FIG. 1 is a perspective view illustrating casing mounting rails according to a first embodiment when installed in a rack.

Supports 2A to 2F are supports of the rack according to the present embodiment. The supports 2A to 2F extend in the vertical direction with respect to the ground with the rack installed. In the following, the ground side face of the rack when the rack is installed, which is the lower face in FIG. 1, is referred to as "the bottom face of the rack." The face of the rack opposite the ground, which is the upper face in FIG. 1, is referred to as "the upper face of the rack." In the following description, a direction directing from the support 2B toward the support 2A is referred to as the "left," and a direction directing from the support 2A toward the support 2B is referred to as the "right."

The support 2A and the support 2B form a front face of the rack, that is, an outer face of the rack on a side through which an electronic device such as a server is put in and out. In the following, a plane formed by the support 2A and the support 2B is referred to as "the front face of the rack." The support 2E and the support 2F form a back face of the rack, that is, an outer face of the rack facing the face through which an electronic device such as a server is put in and out. In the following, a surface formed by the support 2E and the support 2F is referred to as "the back face of the rack." The support 2C is provided in between the support 2A and the support 2E. The support 2D is provided in between the support 2B and the support 2F. The distance between the support 2A and the support 2C and the distance between the support 2B and the support 2D have the same length as the longitudinal length of a casing mounting rail 1L and a casing mounting rail 1R, respectively, as will be described below.

The casing mounting rail 1L and casing mounting rails 11L to 15L are attached to the support 2A. The casing mounting rail 1R and casing mounting rails 11R to 15R are attached to the support 2B. The casing mounting rails 1L and 11L to 15L have the same structure. The casing mounting rails 1R and 11R to 15R have the same structure. The casing mounting rails 1L and 1R, 11L and 11R, 12L and 12R, 13L and 13R, 14L and 14R, and 15L and 15R each form a pair. When a pair of casing mounting rails is described in the following, the casing mounting rail 1L and the casing mounting rail 1R will be described as an example. Each pair of casing mounting rails has nearly a bilateral symmetric structure. In view of this, when the structure of a casing mounting rail is described, the casing mounting rail 1L will be described as an example. In other words, the casing mounting rails 11L to 15L have the same structure as that of the casing mounting rail 1L described below. The casing mounting rails 1R and 11R to 15R have nearly the same structure as a bilateral symmetric structure of the casing mounting rail 1L.

As illustrated in FIG. 1, a direction indicated by the arrow P directing from the front face of the rack to the back face of the rack is referred to as the P direction, and in contrast, a direction indicated by the arrow Q directing from the back face of the rack to the front face of the rack is referred to as the Q direction.

Figure 2:
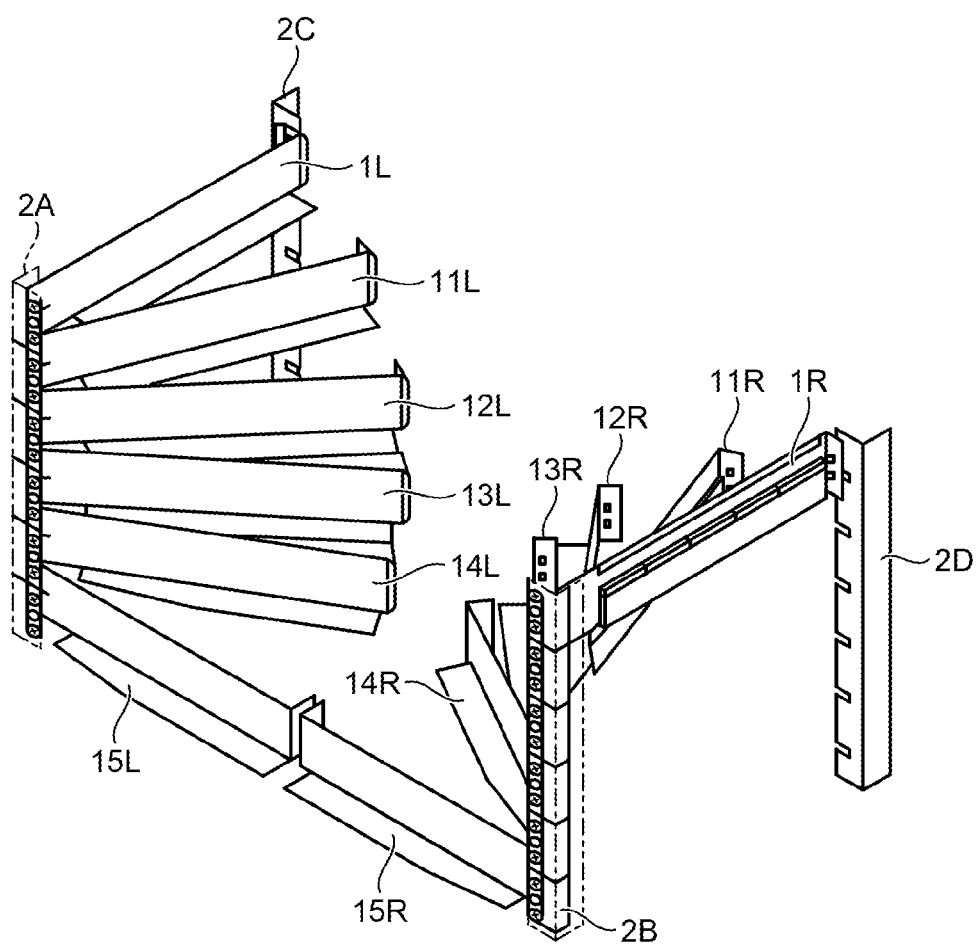
FIG. 2 is a drawing illustrating the rotation of the casing mounting rails according to the first embodiment with respect to a support.

The following describes the rotational motion of the casing mounting rails with respect to the supports of the rack with reference to FIG. 2. FIG. 2 is a drawing illustrating the rotation of the casing mounting rails according to the first embodiment with respect to the supports.

As will be described below, the casing mounting rails 1L and 11L to 15L are attached to the support 2A rotatably in a plane having the longitudinal direction of the support 2A as a normal line. Similarly, the casing mounting rails 1R and 11R to 15R are attached to the support 2B rotatably in a plane having the longitudinal direction of the support 2A as a normal line. FIG. 2 illustrates a shift in the stationary positions of the casing mounting rails during rotation starting from the positions of the casing mounting rails 15L and 15R in parallel to the front face of the rack to the positions of the casing mounting rails 1L and 1R in parallel to the side faces of the rack. The casing mounting rails play a role of blank plates in the state of the casing mounting rails 15L and 15R. The casing mounting rails can mount the casing of an electronic device in the state of the casing mounting rails 1L and 1R.

Figure 3A:
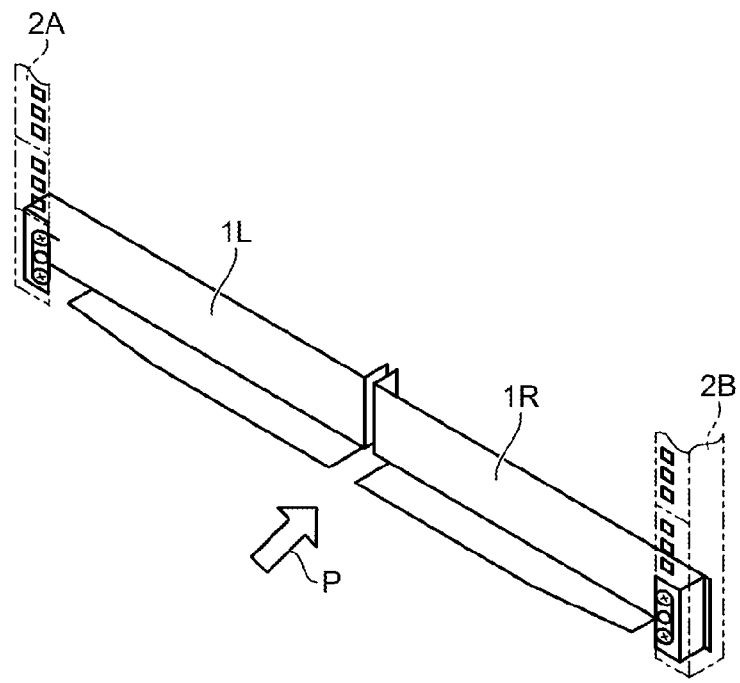
FIG. 3A is a perspective view illustrating the casing mounting rail according to the first embodiment when installed in the rack, viewed in the direction of the arrow P.
Figure 3B:
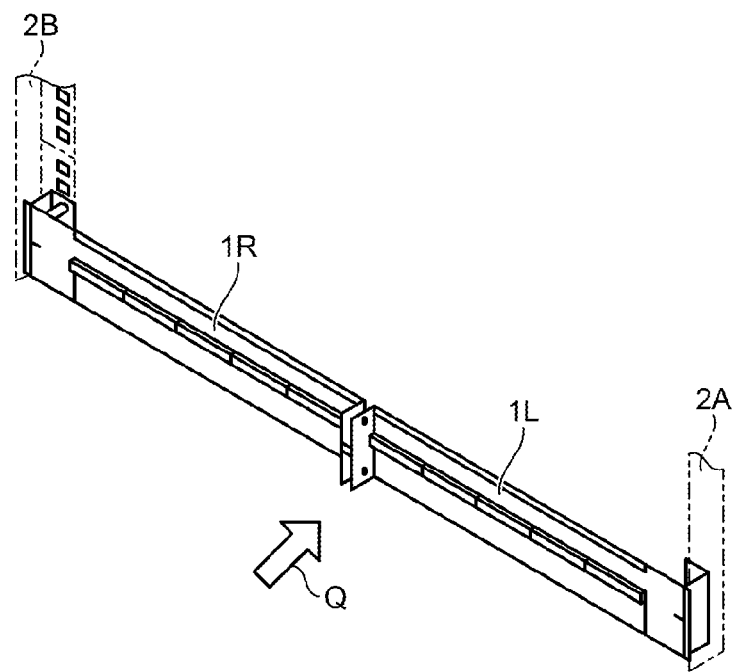
FIG. 3B is a perspective view illustrating the casing mounting rail according to the first embodiment when installed in the rack, viewed in the direction of the arrow Q.
Figure 4A:
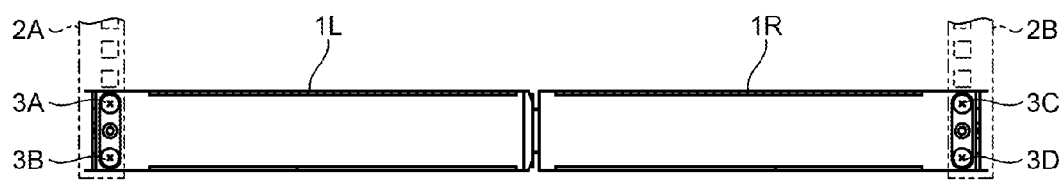
FIG. 4A is a drawing illustrating the casing mounting rails according to the first embodiment viewed in the direction of the arrow P.
Figure 4B:
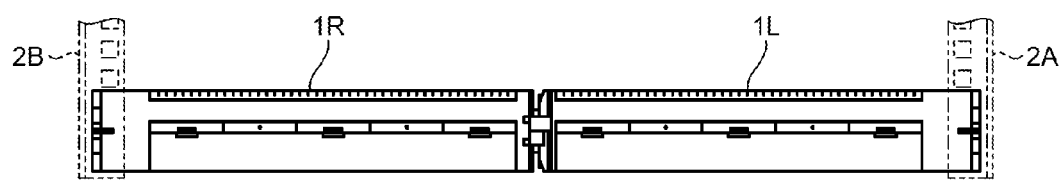
FIG. 4B is a drawing illustrating the casing mounting rails according to the first embodiment viewed in the direction of the arrow Q.

FIG. 3A is a perspective view illustrating the casing mounting rail according to the first embodiment when installed in the rack viewed in the direction of the arrow P. FIG. 3B is a perspective view illustrating the casing mounting rail according to the first embodiment when installed in the rack viewed in the direction of the arrow Q. FIG. 4A is a drawing illustrating the casing mounting rails according to the first embodiment viewed in the direction of the arrow P. FIG. 4B is a drawing illustrating the casing mounting rails according to the first embodiment viewed in the direction of the arrow Q.

In FIG. 3A, to make the state of the casing mounting rail easy to understand, the casing mounting rail 1L and the casing mounting rail 1R in FIG. 1 are illustrated in an enlarged manner. In FIG. 3B, for understanding of the state of the casing mounting rail when viewed from the Q direction, the casing mounting rail 1L and the casing mounting rail 1R in FIG. 1 are illustrated in an enlarged manner. In FIG. 4A, although the casing mounting rail 1L and the casing mounting rail 1R are actually hidden behind the supports 2A and 2B, the supports are illustrated in a perspective manner for the convenience of description.

The casing mounting rail 1L and the casing mounting rail 1R have the same length. As illustrated in FIG. 3A, FIG. 3B, FIG. 4A, and FIG. 4B, when the casing mounting rails 1L and 1R are positioned on the plane formed by the support 2A and the support 2B, the sum of the longitudinal lengths of the casing mounting rails 1L and 1R corresponds to the distance between the support 2A and the support 2B. In other words, the length of the casing mounting rails 1L and 1R corresponds to half the distance between the support 2A and the support 2B.

As illustrated in FIG. 4A, the casing mounting rail 1L is fixed to the support 2A with screws 3A and 3B. The casing mounting rail 1R is fixed to the support 2B with screws 3C and 3D. The fixation between the casing mounting rail 1L and the support 2A will be described below in detail.

In the following description, a side of the casing mounting rail 1L illustrated in FIG. 4A, that is, a side of the casing mounting rail 1L viewed from the P direction in FIG. 3A is referred to as the "front side." A side of the casing mounting rail 1L illustrated in FIG. 4B, that is, a side of the casing mounting rail 1L viewed from the Q direction in FIG. 3B is referred to as the "back side."

Figure 5:
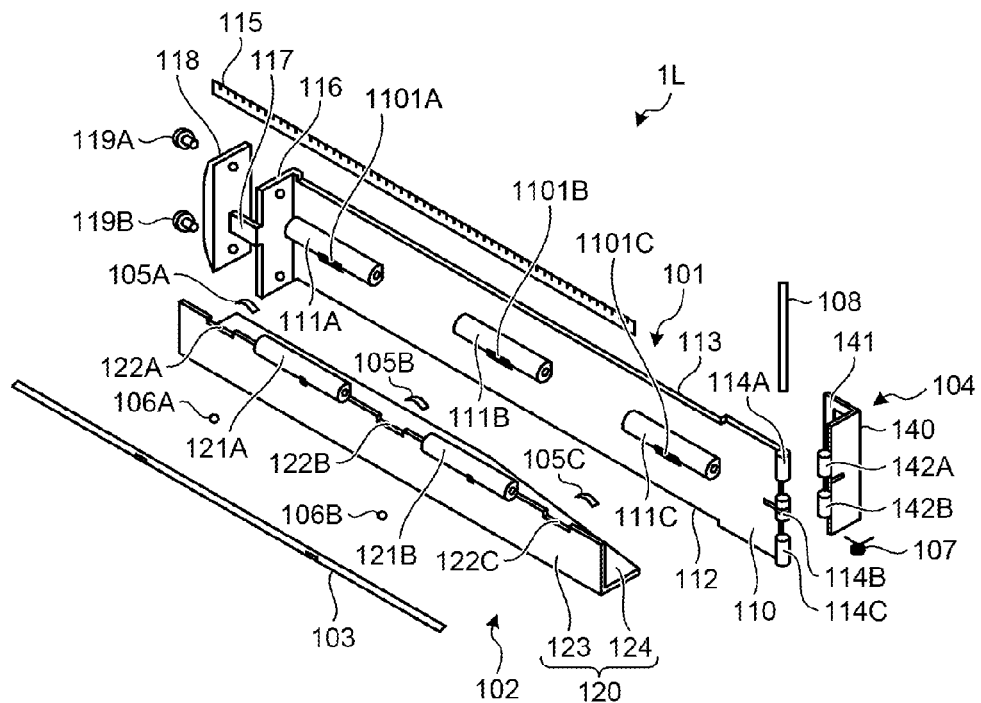
FIG. 5 is an exploded view illustrating the casing mounting rail according to the first embodiment.

The following describes the structure of the casing mounting rail 1L in detail with reference to FIG. 5. FIG. 5 is an exploded view of the casing mounting rail according to the first embodiment.

As illustrated in FIG. 5, the casing mounting rail 1L includes a plate-shaped member 101, an L-shaped member 102, an engaging shaft 103, a coupling member 104, leaf springs 105A to 105C, screws 106A and 106B, a coil spring 107, and an engaging shaft 108.

The plate-shaped member 101 includes a plate member 110, engaging parts 111A to 111C, engaging parts 114A to 114C, a rubber sheet 115, a magnet 118, a protrusion 117, and screws 119A and 119B.

A recess 113 is formed on the transverse end of the plate member 110 on the upper face side of the rack. A recess 112 is formed on the transverse end of the plate member 110 on the bottom face side of the rack. The engaging parts 114A to 114C are formed on the longitudinal end of the plate member 110 on the coupling member 104 side. The engaging parts 111A to 111C are formed on the back side of the plate member 110. A bending part 116 bending in an L shape toward the back side is formed on the longitudinal end of the plate member 110 opposite the coupling member 104. The protrusion 117 extends from the end of the bending part 116 opposite the plate member 110 in a direction departing from the coupling member 104.

The magnet 118 is arranged on the side of the bending part 116 opposite the coupling member 104. The magnet 118 is fixed to the bending part 116 with the screws 119A and 119B. In the present embodiment, the magnet 118 and the screws 119A and 119B are not arranged on the counter casing mounting rail, such as the casing mounting rail 1R corresponding to the casing mounting rail 1L. In place of the magnet 118, a metal attracted to a magnet is arranged on the counter casing mounting rail. This causes, for example, the casing mounting rail 1L and the casing mounting rail 1R to be attracted to each other to stay parallel to the front face of the rack through magnetic force. Consequently, the casing mounting rail according to the present embodiment does not open even when receiving wind or the like, serving as a blank plate satisfactorily. In the present embodiment, the magnet is arranged on one part and the metal attracted to the magnet is arranged on the other part, to which another configuration may be applied. For example, magnets having polarities that are attracted to each other may be arranged. Another locking mechanism such as a bolt may be provided, so long as the casing mounting rails in pairs can be fixed to each other.

The rubber sheet 115, which is plate-shaped and has a length corresponding to the longitudinal length of the recess 113, is arranged on the recess 113 of the plate member 110. This rubber sheet 115 becomes deformed to allow the rotational motion of the L-shaped member 102, as will be described below. The rubber sheet 115 thus arranged leaves no gap on the front face of the rack even when the L-shaped member 102 is in a fixed state, thereby maintaining the effect of cooling electronic devices.

The coupling member 104 includes an L-shaped plate member 140 and engaging parts 142A and 142B.

The engaging parts 142A and 142B are arranged on one transverse end of the L-shaped plate member 140.

A hole 141 for fixation to the support 2A is formed on the surface of the L-shaped plate member 140 opposite the surface having the engaging parts 142A and 142B, that is, on the surface parallel to the plate member 110 in FIG. 5. Although only one hole 141 is visible in FIG. 5, actually three holes are formed. The holes 141 and holes of the support 2A are aligned to each other and are fixed with the screws 3A and 3B illustrated in FIG. 4A, thereby fixing the L-shaped plate member 140 and the support 2A to each other. In the following, the surface of the L-shaped plate member 140 parallel to the plate member 110 in FIG. 5 will be referred to as the "coupling surface."

The plate-shaped member 101 and the coupling member 104 are engaged with each other so that the engaging part 142A is interposed between the engaging parts 114A and 114B and the engaging part 142B is interposed between the engaging parts 114B and 114C. The engaging part 142B is formed with a groove nearly at its center, and the coil spring 107 is fit in the groove. The coil spring 107 is arranged so as to hold the plate member 110 and the L-shaped plate member 140 therein. The engaging shaft 108 is disposed so as to pass through the engaging parts 114A to 114C, the engaging parts 142A and 142B, and the coil spring 107. This causes the plate-shaped member 101 and the coupling member 104 to pivotally move about the engaging shaft 108. In other words, when the coupling member 104 is fixed to the support 2A, the plate-shaped member 101 pivotally moves in a plane with the longitudinal direction of the support 2A as a normal line. When the plate-shaped member 101 is parallel to the coupling surface of the coupling member 104 as in the state of FIG. 5, the longitudinal direction of the plate member 110 extends in a direction connecting between the support 2A and the support 2B (see FIG. 1). When the plate-shaped member 101 in the state of FIG. 5 rotates in a direction departing from the coupling surface of the coupling member 104, the longitudinal direction of the plate member 110 moves from the direction connecting between the support 2A and the support 2B to a direction connecting between the support 2A and the support 2C (see FIG. 1). When the plate-shaped member 101 moves in the direction departing from the coupling surface of the coupling member 104 from the state of FIG. 5, a force acts on the plate member 110 and the L-shaped plate member 140 through the coil spring 107 so as to make the plate member 110 and the L-shaped plate member 140 close to each other. In other words, a force acts on the plate member 110 so that its longitudinal direction is positioned on the plane formed by the support 2A and the support 2B (see FIG. 1). This causes, when no casing is mounted, the plate-shaped member 101 to automatically move to the position of the front face of the rack.

The L-shaped member 102 includes an L-shaped plate member 120 and engaging parts 121A and 121B.

The L-shaped plate member 120 is a plate-shaped member having an L shape formed by a support plate 123 and a mounting plate 124. The support plate 123 is a part of the L-shaped plate member 120 that is parallel to the plate member 110 in FIG. 5. The mounting plate 124 is a part of the L-shaped plate member 120 that is perpendicular to the plate member 110 in FIG. 5.

The engaging parts 121A and 121B are arranged on a transverse end of the support plate 123. Recesses 122A to 122C are formed on the transverse end of the support plate 123 so as to interpose the engaging parts 121A and 121B therebetween.

The mounting plate 124 is formed in a trapezoidal shape of which the width in the normal line direction of the support plate 123 decreases from some midpoint in the longitudinal direction toward the ends. This is in order to facilitate mounting when an electronic device such as a server is mounted. The mounting plate 124 is not necessarily a trapezoid and may be a rectangle.

The plate-shaped member 101 and the L-shaped member 102 are engaged with each other so that the engaging part 121A is interposed between the engaging parts 111A and 111B and the engaging part 121B is interposed between the engaging parts 111B and 111C. The engaging parts 111A to 111C have engaging holes. The engaging shaft 103 is disposed so as to pass through the engaging holes of the engaging parts 111A to 111C and the engaging parts 121A and 121B. This causes the plate-shaped member 101 and the L-shaped member 102 to pivotally move about the engaging shaft 103. In other words, the L-shaped member 102 pivotally moves in a plane perpendicular to the longitudinal direction of the plate member 110. The engaging shaft 103 is fixed to the engaging parts 121A and 121B with a screw 106A that reaches the engaging hole through a through hole formed in the engaging part 121A and a screw 106B that reaches the engaging hole through a through hole formed in the engaging part 121B. This causes the engaging shaft 103 to rotate together with the L-shaped member 102.

The recess 122A is positioned at a place facing an opening 1101A of the engaging part 111A on the plate-shaped member 101. The recess 122B is positioned at a place facing an opening 1101B of the engaging part 111B on the plate-shaped member 101. The recess 122C is positioned at a place facing an opening 1101C of the engaging part 111C on the plate-shaped member 101.

The leaf springs 105A to 105C are arranged in the openings 1101A to 1101C, respectively. The leaf springs 105A to 105C are in contact with the engaging shaft 103 passing through the engaging parts 111A to 111C. The leaf springs 105A to 105C apply a force on the engaging shaft 103 in the transverse direction of the plate member 110 from the recess 112 toward the recess 113. Described below in detail are the arrangement of the leaf springs 105A to 105C and their pressing against the engaging shaft 103.

Figure 6:
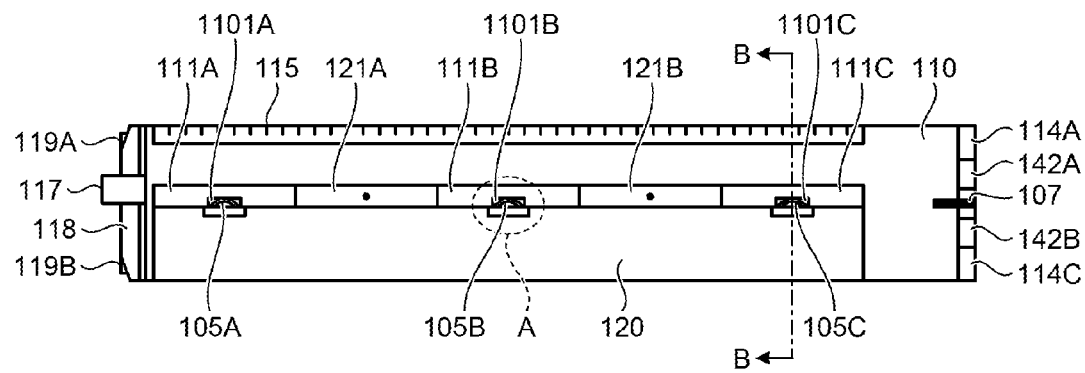
FIG. 6 is a drawing illustrating the casing mounting rail according to the first embodiment viewed in the direction of the arrow Q.
Figure 7:
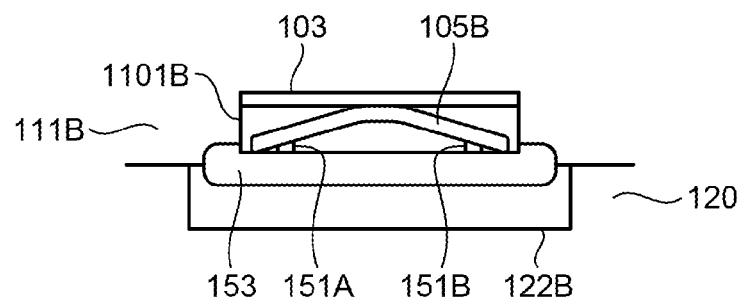
FIG. 7 is an enlarged view illustrating the area A in FIG. 6.
Figure 8:
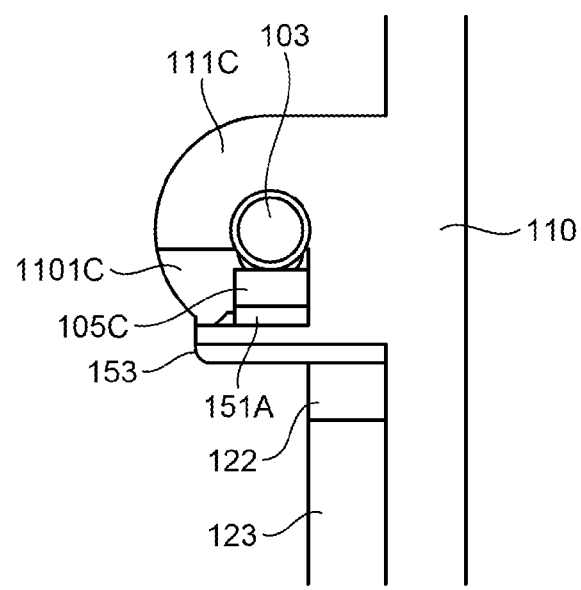
FIG. 8 is the B-B sectional view of FIG. 6.

The following describes the arrangement of the leaf springs 105A to 105C in detail with reference to FIG. 6 to FIG. 8. The leaf spring 105A or the leaf spring 105c is described here as an example, but the same description applies to all the leaf springs 105A to 105C.

FIG. 6 is a drawing illustrating the casing mounting rail according to the first embodiment viewed in the direction of the arrow Q. FIG. 7 is an enlarged view of the area A in FIG. 6. FIG. 8 is the B-B sectional view of FIG. 6.

Parts with numerals attached in FIG. 6 are the same as the parts with the same numerals attached in FIG. 5. As illustrated in FIG. 6, the leaf springs 105A to 105C are arranged at the places of the openings 1101A to 1101C of the engaging parts 111A to 111C, respectively.

More specifically, the leaf spring 105B is arranged as illustrated in FIG. 7. Specifically, a base 153 is arranged on the recess 122B side of the opening 1101B of the engaging part 111B. The leaf spring 105B is placed on the base 153. Fixing parts 151A and 151B are further arranged on the base 153 for fixing the leaf spring 105B. The leaf spring 105B presses the engaging shaft 103 toward the engaging shaft 103 from the base 153.

The following further describes the state of the leaf spring 105C with reference to FIG. 8. As described above, the engaging part 111C is formed on the plate member 110. The opening 1101C is formed in the engaging part 111C at the place where the leaf spring 105C is positioned. As illustrated in FIG. 8, the base 153 that extends perpendicularly from the plate member 110 is arranged on the recess 122C side of the opening 1101C. The fixing part 151A is arranged on the base 153. The leaf spring 105C placed on the base 153 is fixed by the fixing part 151A. The leaf spring 105C presses the engaging shaft 103 toward the engaging shaft 103 from the base 153. For example, in FIG. 8, when the L-shaped member 102 (see FIG. 5) rotates about the engaging shaft 103, the support plate 123 and the recess 122C rotate, and the leaf spring 105C, the base 153, the engaging part 111C, and the like do not rotate.

Figure 9:
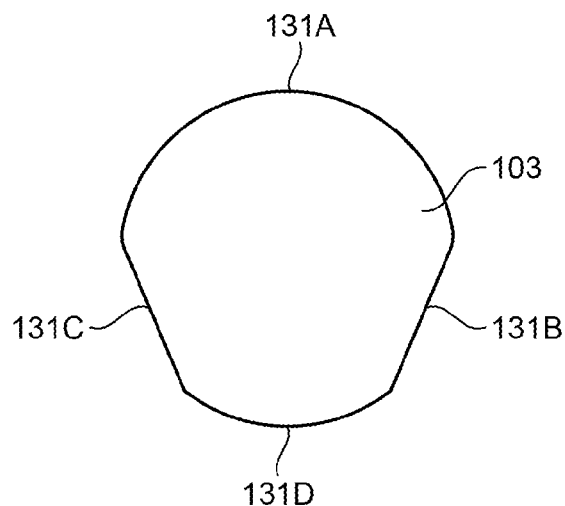
FIG. 9 is a sectional view illustrating an engaging shaft.
Figure 10:
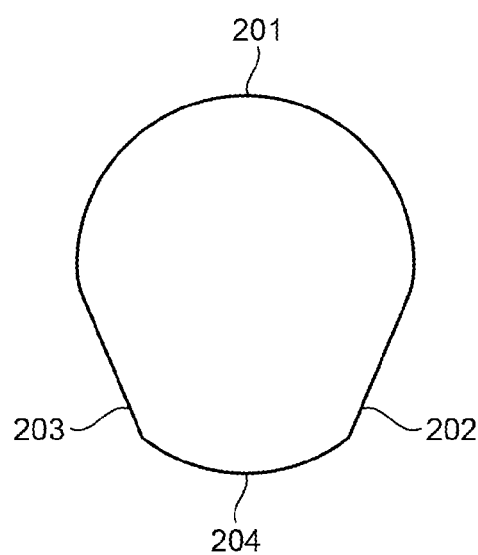

FIG. 9 is a sectional view illustrating the engaging shaft 103. FIG. 10 is a sectional view illustrating a through hole of the engaging part 111A for passing the engaging shaft through.

As illustrated in FIG. 9, the sectional shape of the engaging shaft 103 includes arcs 131A and 131D and tapered parts 131B and 131C. The arcs 131A and 131D are on the circumference of the same circle. In other words, the engaging shaft 103 is obtained by trimming the sides of a rod-shaped member having the shape of the circumference of a circle including the arcs 131A and 131D as a section to form the tapered parts 131B and 131C.

As illustrated in FIG. 10, the sectional shape of the through hole of the engaging part 111A includes arcs 201 and 204 and tapered parts 202 and 203. The tapered parts 202 and 203 and the arc 204 form a bearing for the engaging shaft 103. In the following, the recessed structure formed by the tapered parts 202 and 203 and the arc 204 may be referred to as the "bearing." The engaging part 111A is described here as an example, whereas the engaging parts 111B and 111C also have the same through hole. In this through hole, a line connecting the center of the arc 201 and the center of the arc 204 aligns with the transverse direction of the plate member 110 (see FIG. 5). The arc 201 is arranged on the recess 113 side of the plate member 110, and the arc 204 is arranged on the recess 112 side of the plate member 110.

The arcs 201 and 204 and the arcs 131A and 131D are arcs as parts of the circumference of a circle having the same radius. The angles of the tapered parts 202 and 203 are equal to the angles of the tapered parts 131B and 131C, respectively. The angle of the tapered parts is an angle with respect to a center line with respect to which a section of the engaging shaft 103 in FIG. 9 or a section of the through hole in FIG. 10 is bilaterally symmetric.

Figure 11A:
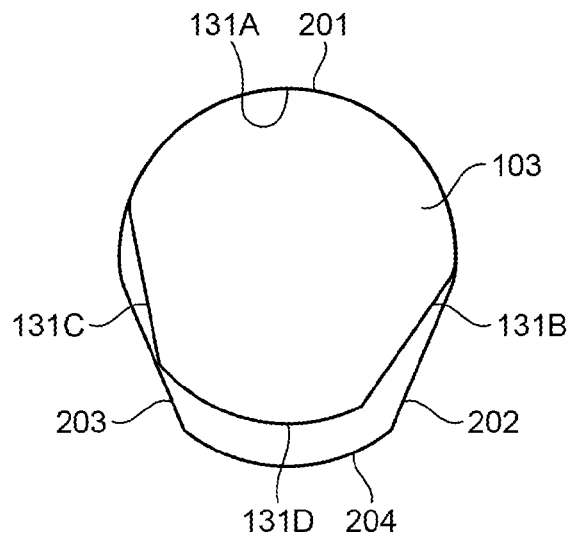
FIG. 11A is a drawing illustrating a state in which the engaging shaft is lifted.
Figure 11B:
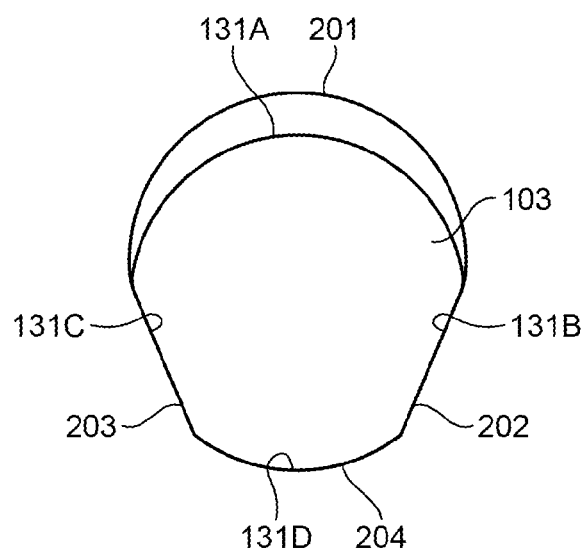
FIG. 11B is a drawing illustrating a state in which the engaging shaft is fit in a bearing.

FIG. 11A is a drawing illustrating a state in which the engaging shaft is lifted. FIG. 11B is a drawing illustrating a state in which the engaging shaft is fit in the bearing. Both FIG. 11A and FIG. 11B illustrate sections in which the engaging shaft 103 passes through the through hole of the engaging part 111A illustrated in FIG. 7. The following describes the fixation of the engaging shaft 103 with reference to FIG. 11A and FIG. 11B. In the description here, for the convenience of description, the direction from the center of the arc 201 toward the center of the arc 204 in FIG. 11A and FIG. 11B is referred to as the downward direction, and the direction from the center of the arc 204 toward the center of the arc 201 is referred to as the upward direction. The upward and downward directions align with the transverse direction of the plate member 110 in FIG. 5.

The engaging shaft 103 is pushed up from below by the leaf springs 105A to 105C (see FIG. 5). With no other force acting on the engaging shaft 103, as illustrated in FIG. 11A, the arc 131A of the engaging shaft 103 is in contact with the upper arc 201 of the through hole of the engaging part 111A. In this case, the engaging shaft 103 can rotate freely within the through hole.

In contrast, when a force larger than the pressing forces of the leaf springs 105A to 105C (see FIG. 5) acts on the engaging shaft 103 downward, the engaging shaft 103 is pressed against the bearing side. This causes the tapered part 131B to be in contact with the tapered part 202, the tapered part 131C to be in contact with the tapered part 203, and the arc 131D to be in contact with the arc 204 as illustrated in FIG. 11B. In this case, the rotational motion of the engaging shaft 103 is inhibited by the parts in contact therewith, fixing the engaging shaft 103 not to rotate within the engaging part 111A. The above describes about the fixation of the engaging shaft 103 with the engaging part 111A, and similarly for the engaging parts 111B and 111C, when the force acts downward, the engaging shaft 103 is fixed also by the engaging parts 111B and 111C.

Figure 12:
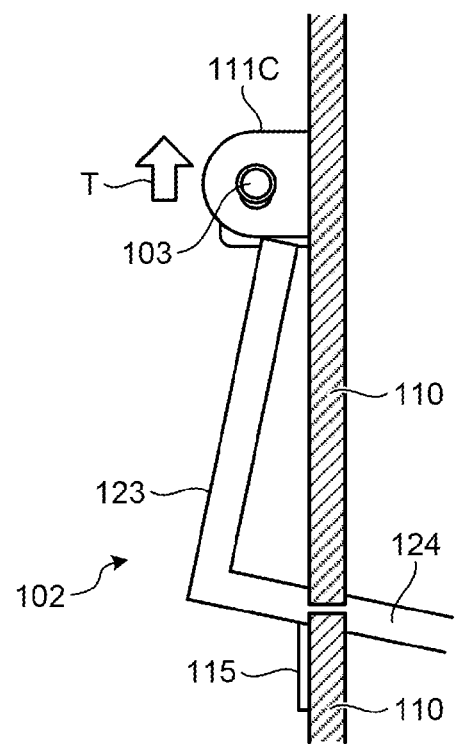
FIG. 12 is a plan view illustrating an L-shaped member in a movable state.
Figure 13:
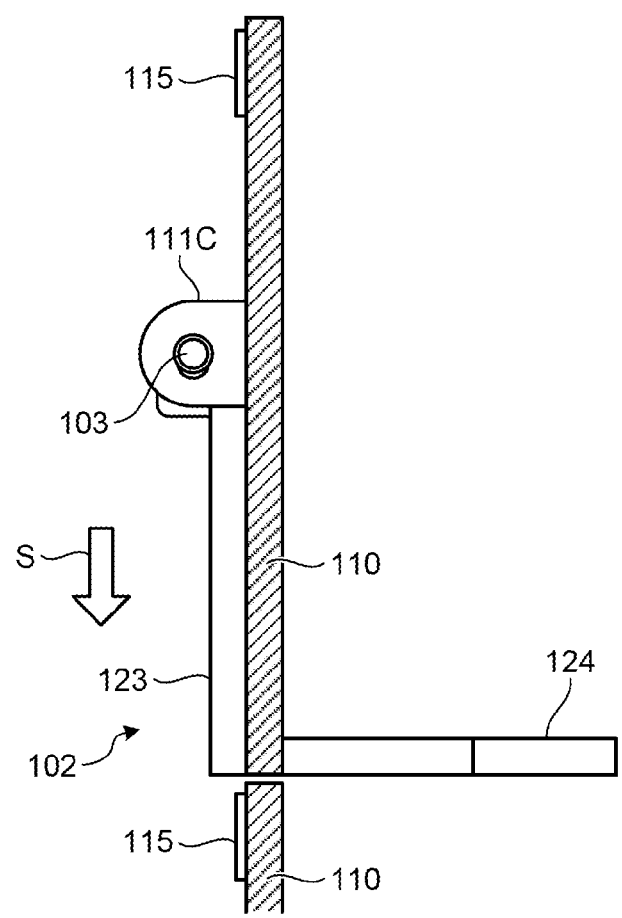
FIG. 13 is a plan view illustrating the L-shaped member in a fixed state.

The following describes overall motion relating to the pivoting motion of the L-shaped member 102 with reference to FIG. 12 and FIG. 13.

FIG. 12 is a plan view illustrating the L-shaped member 102 in a movable state. FIG. 13 is a plan view illustrating the L-shaped member 102 in a fixed state. The description is provided here with the downward direction in FIG. 12 and FIG. 13 referred to as the downward direction and the upward direction in FIG. 12 and FIG. 13 referred to as the upward direction. The downward direction in the drawings is a direction toward the bottom face of the rack, and the upward direction in the drawings is a direction toward the upper face of the rack.

As described above, when no downward force acts on the leaf springs 105A to 105C, the leaf springs 105A to 105C press the engaging shaft 103 upward. This force is represented by a tension T in FIG. 12. As described above, when the tension T acts, the engaging shaft 103 is pressed upward in a state as illustrated in FIG. 11A and allowed to rotate freely within the through hole of the engaging part 111A. In this case, the L-shaped member 102 rotates in a direction departing from the plate member 110 owing to the weight of the mounting plate 124. As a result, as illustrated in FIG. 12, the support plate 123 departs from the plate member 110, tilting the L-shaped member 102.

In this situation, the mounting plate 124 moves toward the lower plate member 110 side through the rotation. As described above, the recess 113 is formed on the upper side of the plate member 110, and the rubber sheet 115 is arranged therein. As a result, the mounting plate 124 can move without interfering with the plate member 110 through the deformation of the rubber sheet 115. This causes the mounting plate 124 to move from the inside of the rack toward the outside thereof, preventing it from being in contact with the casing of a server or the like.

The following describes a case in which a downward force is acting on the leaf springs 105A to 105C (see FIG. 5). The force acting on the leaf springs 105A to 105C (see FIG. 5) is represented by a force S in FIG. 13. This force S is a force acting when the casing of a serve or the like is mounted. As described above, when the force S acts, the engaging shaft 103 moves downward to be fit into the bearing of the engaging part 111A. This fixes the engaging shaft 103 not to rotate.

Because the engaging shaft 103 and the L-shaped member 102 are fixed to each other, when it is difficult for the engaging shaft 103 to rotate, the L-shaped member 102 is also fixed and has difficulty in pivotally moving.

In this case, the L-shaped member 102 is fixed in the state of FIG. 13. Specifically, the support plate 123 is in contact with the plate member 110. The mounting plate 123 is positioned in a direction perpendicular to the plate member 110, that is, in a direction parallel to the bottom face of the rack. In this situation, the mounting plate 124 passes through the recess 112 (see FIG. 5) on the lower side of the plate member 110. In other words, when the casing of a server or the like is mounted on the mounting plate 124, the L-shaped member 102 is fixed as in the state of FIG. 13 through the weight of the casing and supports the casing.

Figure 14:
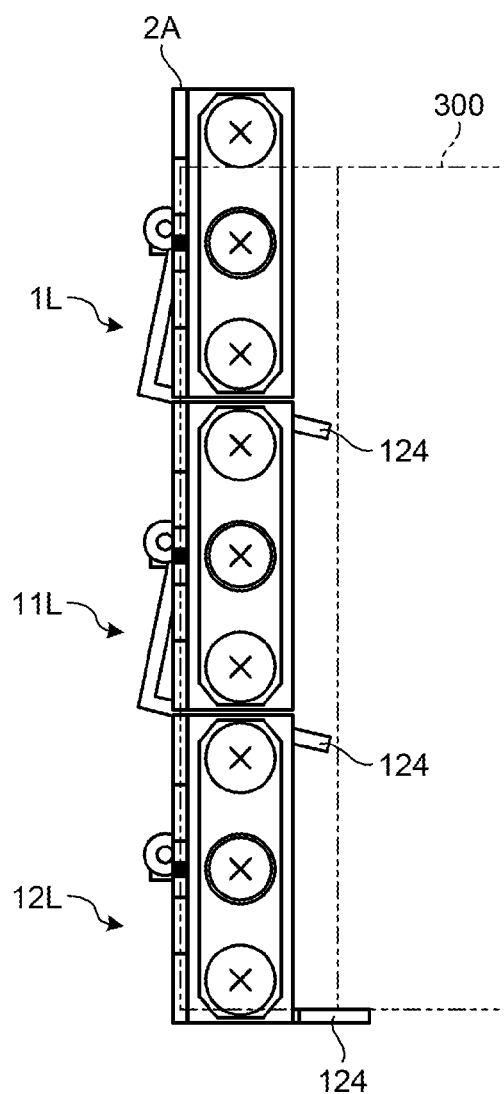
FIG. 14 is a drawing illustrating a state in which a casing is mounted.

FIG. 14 is a diagram illustrating a state in which a casing is mounted. In FIG. 14, the casing mounting rails 1L, 11L, and 12L are in a position parallel to the side face of the rack, that is, the position of the casing mounting rail 1L in FIG. 2. In FIG. 14, a server 300 illustrated by the two-dot chain line is mounted. FIG. 14 illustrates a state in which the casing of the server 300 is mounted on the casing mounting rail 12L among the casing mounting rails 1L, 11L, and 12L attached to the support 2A.

Because the weight of the server is acting on the casing mounting rail 12L, the mounting plate 124 of the casing mounting rail 12L is fixed in a direction parallel to the bottom face of the rack. In this state, the server 300 is mounted on the mounting plate 124 of the casing mounting rail 12L.

In contrast, the weight of the server is not acting on the casing mounting rails 1L and 11L. As a result, the casing mounting rails 1L and 11L can pivotally move. This causes the casing mounting rails 1L and 11L to rotate in a direction toward the outside of the rack through the weights of the respective mounting plates 124. As a result, as illustrated in FIG. 14, the mounting plates 124 of the casing mounting rails 1L and 11L retract to a position off a position being in contact with the server. This causes the server 300 to be smoothly stored in the rack without interfering with the mounting plates 124 of the casing mounting rails 1L and 11L.

Figure 15A:
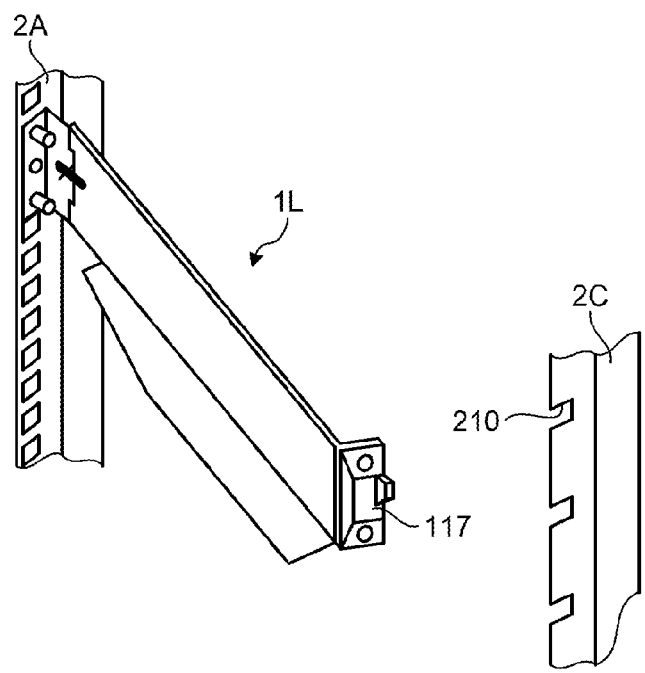
FIG. 15A is a perspective view illustrating a state in which the casing mounting rail is rotating.
Figure 15B:
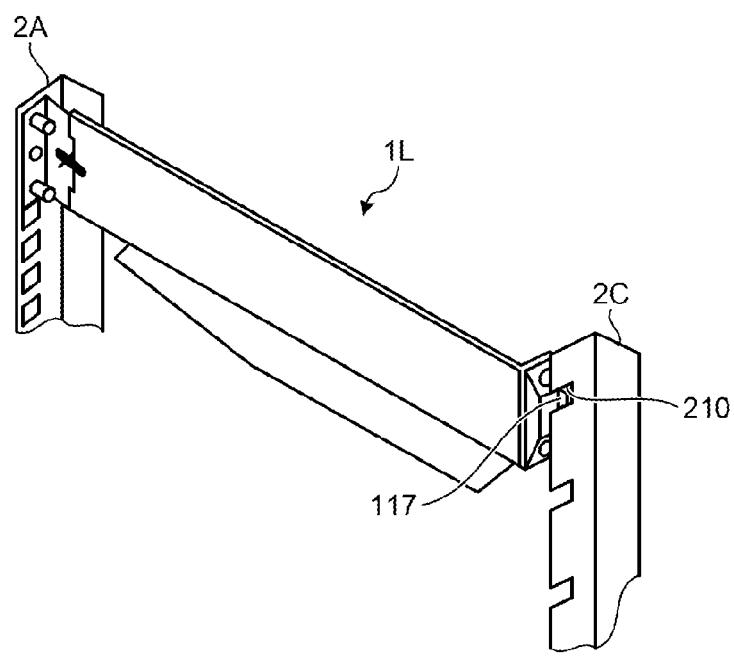
FIG. 15B is a perspective view illustrating a state in which the rotation of the casing mounting rail is completed.
Figure 16:
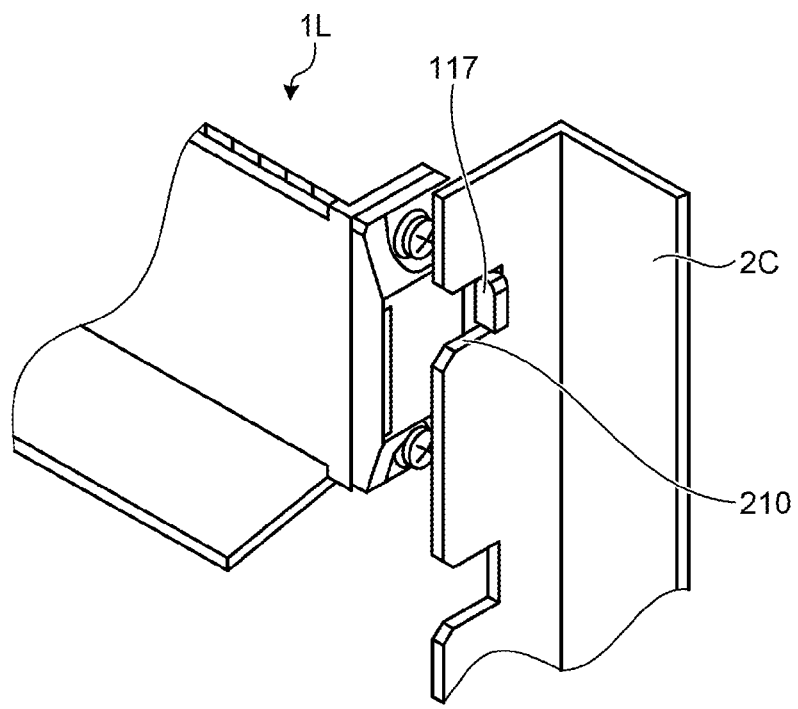
FIG. 16 is an enlarged view illustrating a fitting part between the casing mounting rail and the rack.

The following describes the support of the casing mounting rail 1L by the support 2C with reference to FIG. 15A, FIG. 15B, and FIG. 16. FIG. 15A is a perspective view illustrating a state in which the casing mounting rail is rotating. FIG. 15B is a perspective view illustrating a state in which the rotation of the casing mounting rail is completed. FIG. 16 is an enlarged view illustrating a fitting part between the casing mounting rail and the rack.

When the casing mounting rail 1L becomes parallel to the side face of the rack, in order to mount the casing of an electronic device, not only the side fixed to the support 2A but also the opposite side are fixed. This fixation of the casing mounting rail 1L is performed by the support 2C.

As illustrated in FIG. 15A, the casing mounting rail 1L has the protrusion 117. A recess 210 is formed in the support 2C at a position corresponding to the protrusion 117 when the casing mounting rail 1L becomes parallel to the side face of the rack. As illustrated in FIG. 15B and FIG. 16, when the casing mounting rail 1L becomes parallel to the side face of the rack, the protrusion 117 and the recess 210 are fit to each other. This causes the support 2C to support the protrusion 117 through the recess 210 when a force acts on the casing mounting rail 1L toward the bottom face of the rack when, for example, a casing is mounted, thereby supporting the casing mounting rail 1L.

Figure 17A:
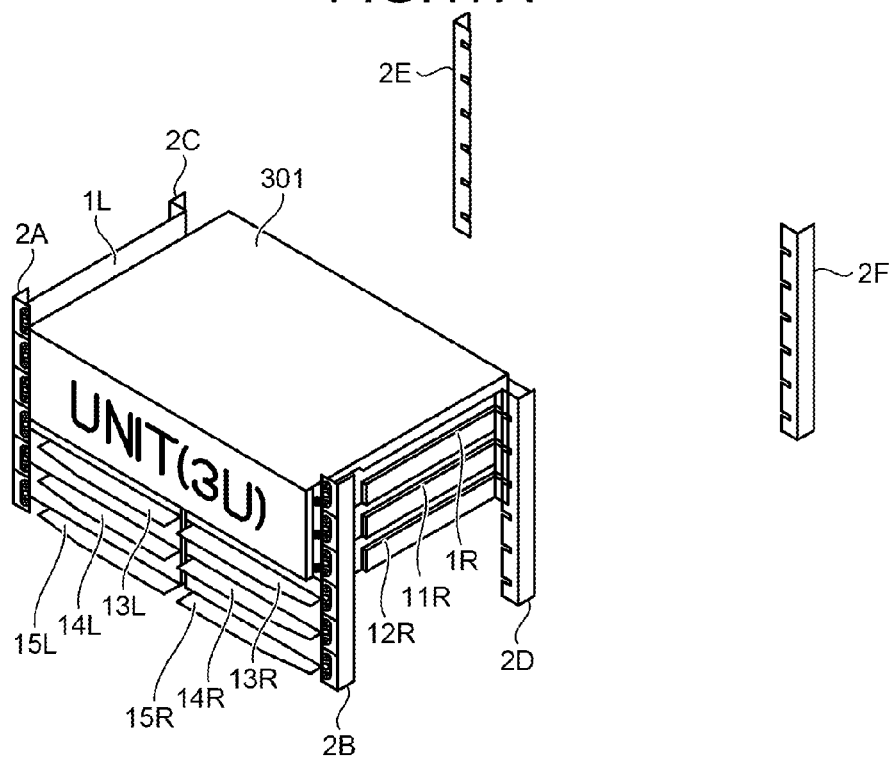
FIG. 17A is a perspective view illustrating a state in which a casing is mounted.
Figure 17B:
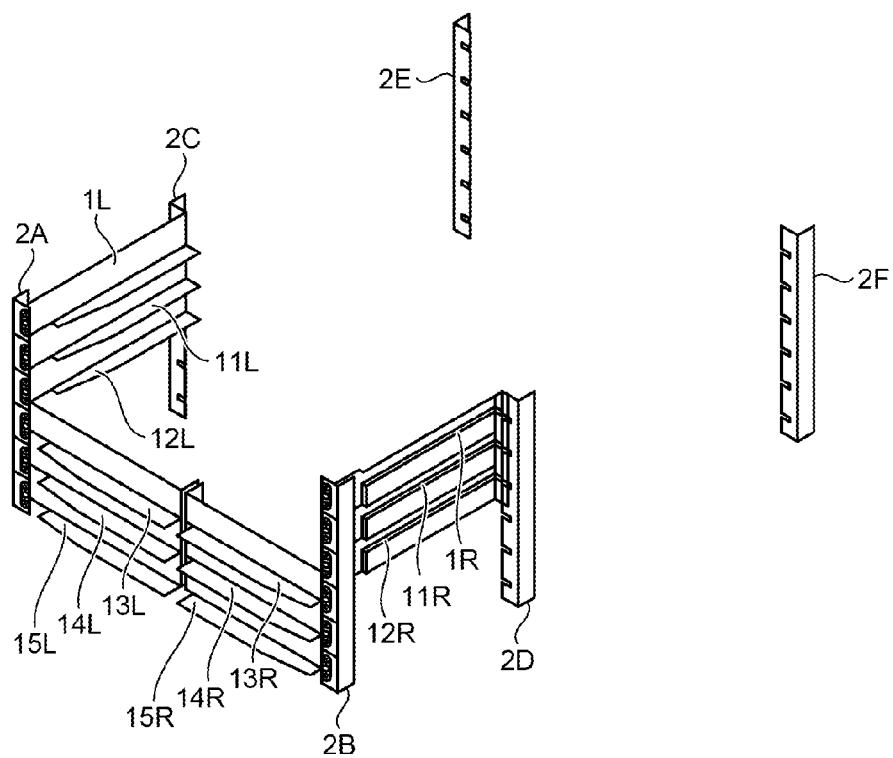
FIG. 17B is a drawing illustrating a state of the casing mounting rails when the casing is mounted.

The following describes a state in which the casing of a server is mounted with reference to FIG. 17A and FIG. 17B.

FIG. 17A is a perspective view illustrating a state in which a casing is mounted. FIG. 17B is a drawing illustrating a state of the casing mounting rails when the casing is mounted. FIG. 17A is a drawing illustrating a case when a server 301 is mounted on the rack in the state of FIG. 1. FIG. 17B illustrates a state when the server 301 is removed in FIG. 17A.

As illustrated in FIG. 17A and FIG. 17B, when the 3 U server 301 is inserted, three pairs of casing mounting rails, that is, the casing mounting rails 1L, 11L, 12L, 1R, 11R, and 12R are pushed inside the rack. The casing mounting rails 1L, 11L, and 12L are fit into the support 2C. The casing mounting rails 1R, 11R, and 12R are fit into the support 2D. The casing mounting rails 12L and 12R are fixed through the weight of the server 301 and support the casing of the server 301 from the bottom face side of the rack. The casing mounting rails 13L to 15L and 13R to 15R maintain the function as blank plates even after the server 301 is mounted.

When the server 301 is removed from the state of FIG. 17A, the casing mounting rails 1L, 11L, 12L, 1R, 11R, and 12R rotate toward the front face of the rack through a force applied by the coil spring 107 and stop at the position parallel to the front face of the rack, thus returning to the state of FIG. 1.

As described above, the casing mounting rail according to the present embodiment has a role of a blank plate when no electronic device is mounted. When the casing mounting rail according to the present embodiment mounts an electronic device, simply inserting the electronic device pushes in an appropriate number of the casing mounting rail, thereby exhibiting the function of mounting the casing. In addition, simply removing the mounted electronic device causes the casing mounting rail according to the present embodiment to automatically return to a position as the blank plate to play the role of the blank plate. This eliminates the need for operators to consider the size of blank plates to be removed when mounting an electronic device, eliminates a process of removing blank plates, and saves time and effort for fixing rails to supports. This allows operators to reduce time and effort in operation. In the fixation of rails, time and effort have been needed for alignment for fixing rails to the support on the front face of the rack and the support on the back face of the rack; such time and effort are also reduced. After removing the mounted electronic device, processes of selecting and installing blank plates according to space have been conventionally needed; such time and effort are also reduced using the casing mounting rail according to the present embodiment.

[b] Second Embodiment

The following describes a rack and a casing mounting rail according to a second embodiment. The present embodiment differs from the first embodiment in that casing mounting rails are arranged in a rack so that a deep casing can be mounted. The casing mounting rail according to the present embodiment has the same configuration as that according to the first embodiment.

Figure 18A:
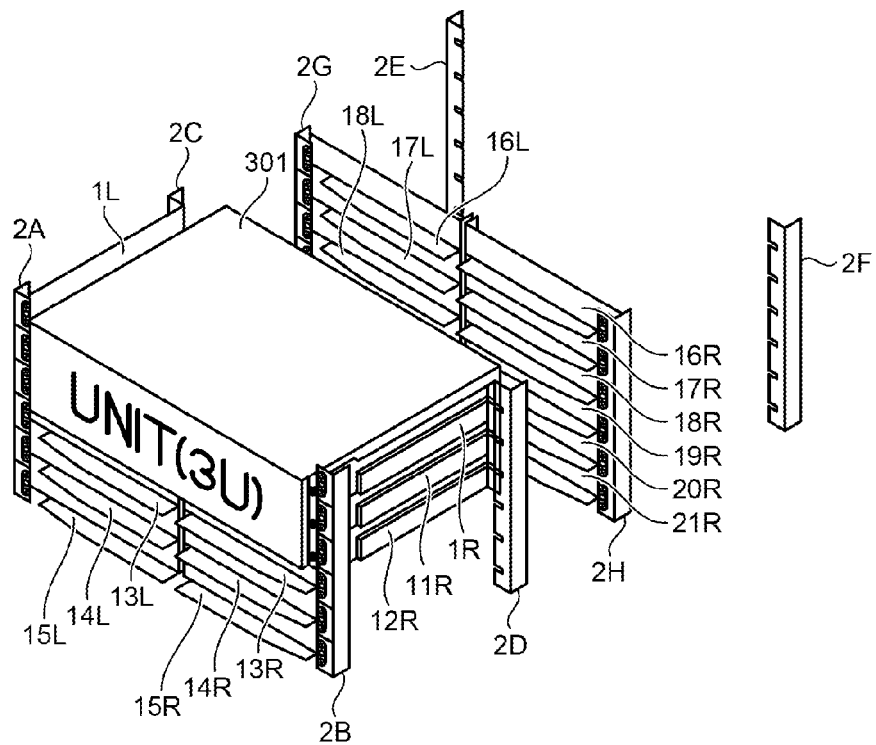
FIG. 18A is a perspective view illustrating a state in which a shallow casing is mounted.
Figure 18B:
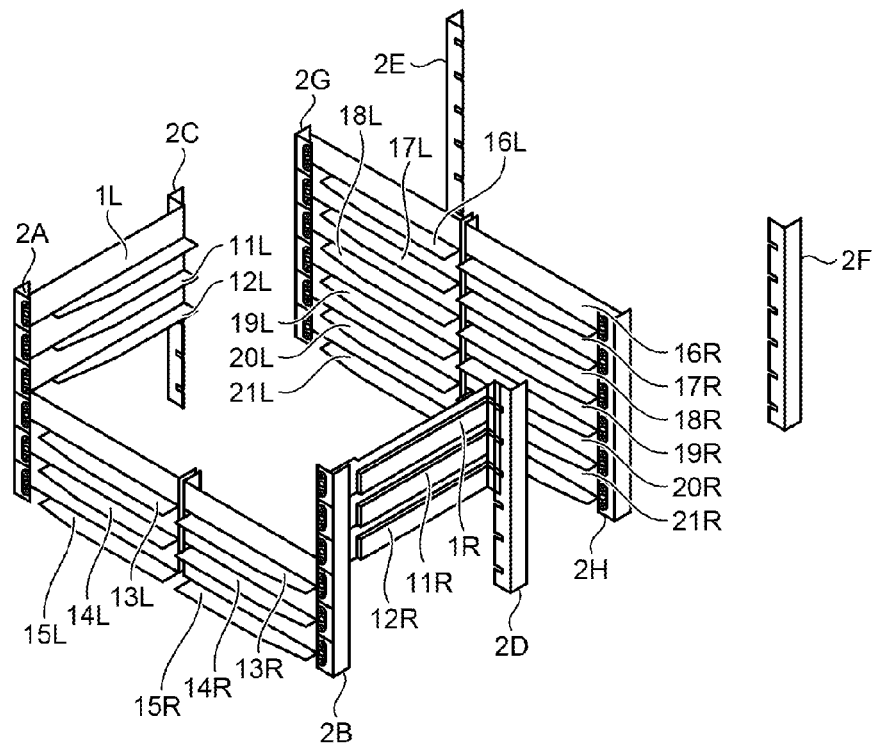
FIG. 18B is a drawing illustrating a state of casing mounting rails when the shallow casing is mounted.
Figure 19A:
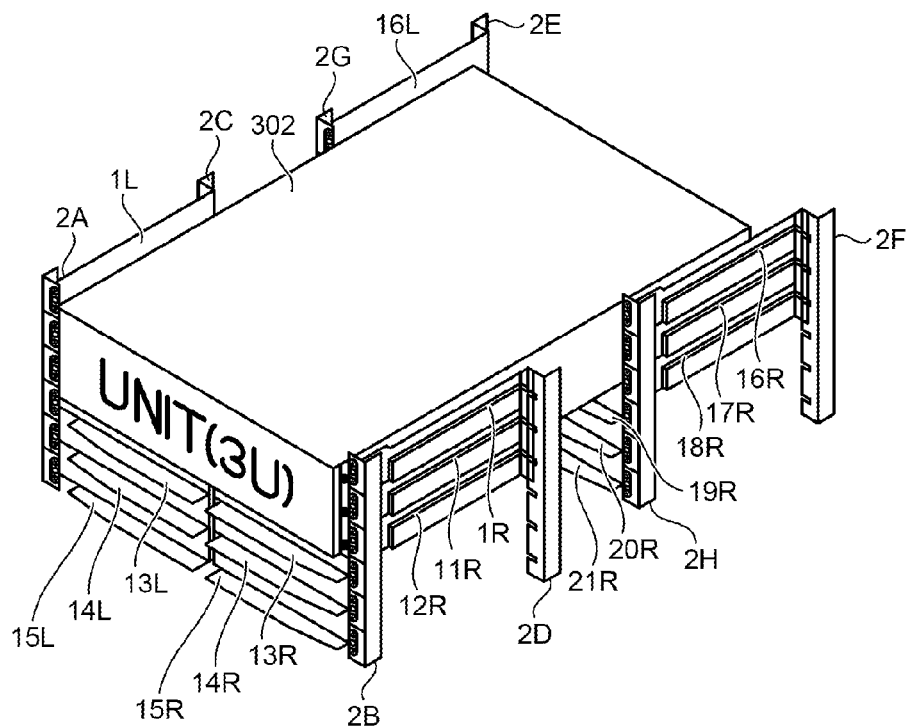
FIG. 19A is a perspective view illustrating a state in which a deep casing is mounted.
Figure 19B:
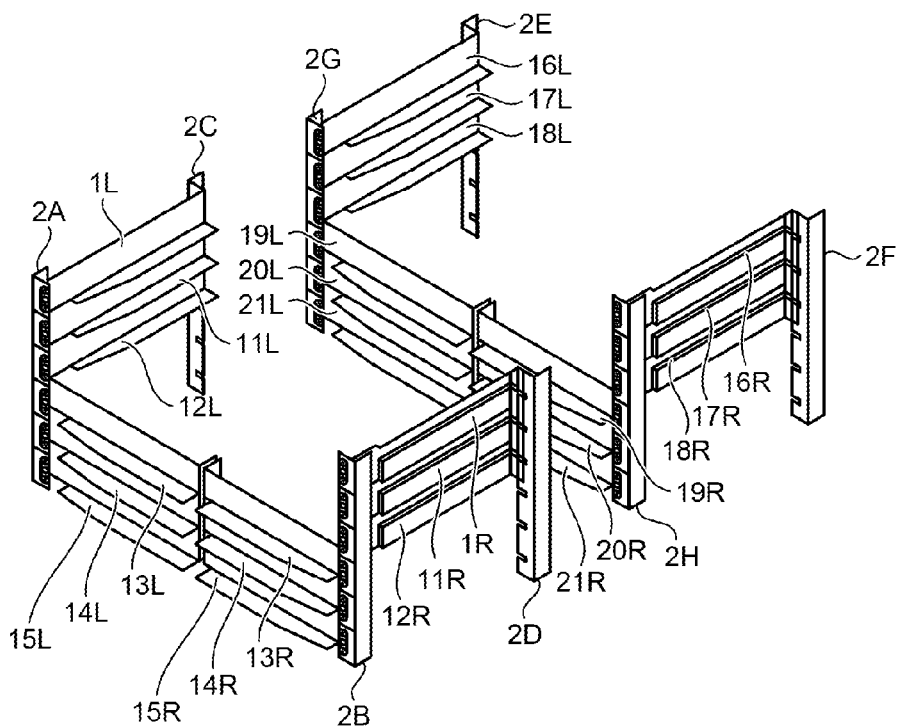
FIG. 19B is a drawing illustrating a state of casing mounting rails when the deep casing is mounted.

FIG. 18A is a perspective view illustrating a state in which a shallow casing is mounted. FIG. 18B is a drawing illustrating a state of casing mounting rails when the shallow casing is mounted. FIG. 19A is perspective view illustrating a state in which a deep casing is mounted. FIG. 19B is a drawing illustrating a state of casing mounting rails when the deep casing is mounted.

In the present embodiment, as illustrated in FIG. 18A to FIG. 19B, in addition to the casing mounting rails 1L, 11L to 15L and 1R, 11R to 15R, casing mounting rails 16L to 21L and 16R to 21R are arranged also in between the front face of the rack and the back face of the rack.

To attach the casing mounting rails 16L to 21L and 16R to 21R, a support 2G and a support 2H are provided in between the support 2C and the support 2E and in between the support 2D and the support 2F, respectively in the rack. The distance between the support 2G and the support 2E and the distance between the support 2H and the support 2F correspond to the longitudinal distances of the casing mounting rails 16L to 21L and 16R to 21R, respectively.

The casing mounting rails 16L to 21L and 16R to 21R are fit in the support 2E and the support 2F, respectively, when they become parallel to the side faces of the rack.

When no electronic device is mounted, the casing mounting rails 16L to 21L and 16R to 21R are closed at a position of a plane formed by the support 2G and the support 2H.

As illustrated in FIG. 18A and FIG. 18B, when the shallow casing is mounted, the casing does not reach the casing mounting rails 16L to 21L and 16R to 21R. In other words, for the shallow casing, the casing mounting rails 1L and 11L to 15L and 1R and 11R to 15R can support the casing. As a result, the casing mounting rails 16L to 21L and 16R to 21R are closed at the position of the plane formed by the support 2G and the support 2H.

As illustrated in FIG. 19A and FIG. 19B, when the deep casing is mounted, the casing reaches the casing mounting rails 16L to 21L and 16R to 21R. In other words, for the deep casing, the casing mounting rails 1L and 11L to 15L and 1R and 11R to 15R alone cannot support the casing. As a result, part of the casing mounting rails 16L to 21L and 16R to 21R coming into contact with the casing are pushed in to play the role of the casing mounting rail. Because a server 302 is 3 U in FIG. 19A and FIG. 19B, the casing mounting rails 16L to 18L and 16R to 18R are pushed in. The casing mounting rails 12L, 12R, 18L, and 18R play the role of the casing mounting rail. This supports the deep casing stably.

With the back of the shallow casing obstructed by the casing mounting rails 16L to 21L and 16R to 21R, the exhaust air of the shallow casing is discharged to the side of rack, and the exhaust air of the deep casing is prevented from returning to the front by the casing mounting rails 16L to 21L and 16R to 21R. As a result, the cooling effect is maintained even for the shallow casing.

As a modification, the casing mounting rails 16L to 21L and 16R to 21R may be reticulated, so long as their strength is ensured. Making them reticular causes the exhaust air of the shallow casing to reach the back face of the rack and makes the flow of the exhaust air similar to that of the first embodiment, thus achieving nearly the same cooling effect as the first embodiment. As another modification, the casing mounting rails 16L to 21L and 16R to 21R may be arranged at positions parallel to the sides of the rack at all times. In this case, the casing mounting rails 16L to 21L and 16R to 21R do not partition the rack in the middle, thus achieving nearly the same cooling effect as the first embodiment.

As described above, the rack and the casing mounting rail according to the present embodiment holds even a deep casing. Even the deep casing can be mounted simply by pushing it, thus reducing working time for installing electronic devices.

One aspect of the present invention reduces the trouble with mounting an electronic device to a rack.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A casing mounting rail for supporting an electronic device, comprising:
   a coupling member coupled to a support column of a rack;
   a plate-shaped member rotatably engaged with the coupling member with one longitudinal end as an axis;
   a mounting member including a first flat plate and a second flat plate orthogonal to the first flat plate, with a transverse end of the first flat plate rotatably engaged with one plate face of the plate-shaped member with a longitudinal direction of the plate-shaped member as an axis and with a plate face of the first flat plate in contact with the one plate face, the second flat plate protruding from one transverse end of the plate-shaped member; and
   a fixing mechanism that couples the mounting member with the plate face of the first flat plate to the one plate face in a rotatable motion.

2. The casing mounting rail according to claim 1, wherein, when the casing mounting rail and another casing mounting rail are attached to two respective support columns arranged side by side on a front face of the rack, a total length of the longitudinal length of the plate-shaped member of the casing mounting rail and the longitudinal length of the another casing mounting rail has a sufficient length to cover space between the two support columns with the plate-shaped member positioned on a plane formed by the two support columns.

3. The casing mounting rail according to claim 1, wherein
   engaging parts of the plate-shaped member and the mounting member have engaging holes and an engaging shaft disposed in the engaging holes to engage the plate-shaped member and the mounting member,
   the engaging shaft has a tapered shape in the transverse direction of the first flat plate, and
   the engaging hole of the plate-shaped member has a bearing with a tapered shape into which the engaging shaft is fit in the transverse direction toward the one end of the plate-shaped member.

4. The casing mounting rail according to claim 1, further comprising a locking mechanism that, when the casing mounting rail and another casing mounting rail are attached to two respective support columns arranged side by side on a front face of the rack, fixes the two casing mounting rails to each other with the plate-shaped member positioned on a plane formed by the two support columns.

5. A blank plate for supporting an electronic device, comprising:
   a coupling member coupled to a support column of a rack;
   a plate-shaped member rotatably engaged with the coupling member with one longitudinal end as an axis;
   a mounting member including a first flat plate and a second flat plate orthogonal to the first flat plate, with a transverse end of the first flat plate rotatably engaged with one plate face of the plate-shaped member with a longitudinal direction of the plate-shaped member as an axis and with a plate face of the first flat plate in contact with the one plate face, the second flat plate protruding from one transverse end of the plate-shaped member; and
   a fixing mechanism that couples the mounting member with the plate face of the first flat plate to the one plate face in a rotatable motion.

6. A rack mount system comprising:
   a rack;
   a first casing mounting rail; and
   a second casing mounting rail, wherein
   the rack includes:
   two first support columns that form a front face of a rectangular parallelepiped area;
   two second support columns that form a back face of the rectangular parallelepiped area; and
   two third support columns that are arranged on respective side faces of the rectangular parallelepiped area and in between the first support columns and the second support columns, and
   the first casing mounting rail and the second casing mounting rail each include:
   a coupling member coupled to the first support column of the rack;
   a plate-shaped member rotatably engaged with the coupling member with one longitudinal end as an axis;
   a mounting member including a first flat plate and a second flat plate orthogonal to the first flat plate, with a transverse end of the first flat plate rotatably engaged with one plate face of the plate-shaped member with a longitudinal direction of the plate-shaped member as an axis and with a plate face of the first flat plate in contact with the one plate face, the second flat plate protruding from one transverse end of the plate-shaped member; and
   a fixing mechanism that couples the mounting member with the plate face of the first flat plate to the one plate face in a rotatable motion, and the first casing mounting rail and the second casing mounting rail are attached to the respective first support columns so as to face each other and are fit into the third support columns when rotated with the first support columns as axes and positioned on the side faces of the rectangular parallelepiped area.

7. The rack mount system according to claim 6, further comprising:
   a third casing mounting rail and a fourth casing mounting rail, wherein the rack further includes:
   two fourth support columns arranged on the respective side faces of the rectangular parallelepiped area and in between the third supports and the second supports, and
   the third casing mounting rail and the fourth casing mounting rail each include:
   a coupling member coupled to the fourth support column of the rack;
   a plate-shaped member rotatably engaged with the coupling member with one longitudinal end as an axis;
   a mounting member including a first flat plate and a second flat plate orthogonal to the first flat plate, with a transverse end of the first flat plate rotatably engaged with one plate face of the plate-shaped member with the longitudinal direction of the plate-shaped member as an axis and with a plate face of the first flat plate in contact with the one plate face, the second flat plate protruding from one transverse end of the plate-shaped member; and
   a fixing mechanism that couples the mounting member with the plate face of the first flat plate to the one plate face in a rotatable motion, and
   the third casing mounting rail and the fourth casing mounting rail are attached to the respective fourth support columns so as to face each other and are fit into the second support columns when rotated with the fourth support columns as axes and positioned on the side faces of the rectangular parallelepiped area.

8. A rack mount system comprising: a rack; a first blank plate; and a second blank plate, wherein the rack includes:

two first support columns that form a front face of a rectangular parallelepiped area;

two second support columns that form a back face of the rectangular parallelepiped area; and two third support columns that are arranged on the respective side faces of the rectangular parallelepiped area and in between the first support columns and the second support columns, and the first blank plate and the second blank plate each include:

a coupling member coupled to the support column of the rack;

a plate-shaped member rotatably engaged with the coupling member with one longitudinal end as an axis;

a mounting member including a first flat plate and a second flat plate orthogonal to the first flat plate, with a transverse end of the first flat plate rotatably engaged with one plate face of the plate-shaped member with a longitudinal direction of the plate-shaped member as an axis and with a plate face of the first flat plate in contact with the one plate face, the second flat plate protruding from one transverse end of the plate-shaped member; and a fixing mechanism that couples the mounting member with the plate face of the first flat plate to the one plate face in a rotatable motion, and the first blank plate and the second blank plate are attached to the respective first support columns so as to face each other and are fit into the third support columns when rotated with the first support columns as axes and positioned on the side faces of the rectangular parallelepiped area.

* * * * *